(12) United States Patent
Jagannathan et al.

(10) Patent No.: US 10,361,732 B1
(45) Date of Patent: Jul. 23, 2019

(54) FAULT DETECTION IN A LOW VOLTAGE DIFFERENTIAL SIGNALING (LVDS) SYSTEM

(71) Applicant: NXP USA, INC., Austin, TX (US)

(72) Inventors: Srikanth Jagannathan, Austin, TX (US); Kumar Abhishek, Bee Cave, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/156,088

(22) Filed: Oct. 10, 2018

(51) Int. Cl.
*H04B 17/18* (2015.01)
*H04B 1/04* (2006.01)
*H04B 17/17* (2015.01)
*H02H 3/16* (2006.01)

(52) U.S. Cl.
CPC ........... *H04B 1/0466* (2013.01); *H02H 3/162* (2013.01); *H04B 17/17* (2015.01); *H04B 17/18* (2015.01)

(58) Field of Classification Search
CPC . H04B 3/46; H04B 17/17; H04B 1/02; H04B 1/0466; H04B 17/18
USPC ................... 375/224, 257, 286, 295
See application file for complete search history.

(56) References Cited

U.S. PATENT DOCUMENTS 5,796,276 A * 8/1998 Phillips ................. H03K 17/063 323/315
6,320,406 B1 11/2001 Morgan et al.
6,320,408 B1 * 11/2001 Kwong .......... H03K 19/018528 326/31
6,563,322 B1 * 5/2003 Hannan .................... H04L 25/08 324/511
6,943,591 B1 9/2005 Hannan et al.
8,884,629 B1 * 11/2014 Kumar .................. H03F 1/0277 324/523
2003/0151396 A1 * 8/2003 Self .......................... G05F 3/262 323/312
2005/0110515 A1 5/2005 Ju et al.
2009/0167266 A1 * 7/2009 Al-Shyoukh ........... G05F 1/569 323/276
2010/0246647 A1 * 9/2010 Maillard .................. H04B 1/58 375/220
2013/0090148 A1 * 4/2013 Kettunen ............... H01L 23/647 455/552.1
2013/0268812 A1 * 10/2013 Liu ......................... G05B 13/02 714/57
2014/0292292 A1 * 10/2014 Koski .................. H02H 7/1213 323/271

(Continued)

*Primary Examiner* — Emmanuel Bayard

(57) ABSTRACT

An integrated circuit includes a transmitter having a data input coupled to receive a single-ended data signal, a reference input coupled to receive a bandgap reference, a first differential output, and a second differential output. The transmitter is configured to, during normal operation, convert the single-ended data signal at the data input into a first differential signal at the first differential output and a second differential signal at the second differential output in which the first differential signal and the second differential signal are complementary to each other. A fault detection circuit is coupled to the first and second differential outputs and is configured to detect a load short fault condition and a bandgap short condition based on the first and second differential signals at the first and second differential outputs while forcing the data input to zero.

20 Claims, 6 Drawing Sheets

(56) References Cited

U.S. PATENT DOCUMENTS

| | | | |
|---|---|---|---|
| 2015/0185293 A1* | 7/2015 | Milano | G01R 31/2884 |
| | | | 324/251 |
| 2017/0019093 A1* | 1/2017 | Kanda | H03K 3/356113 |
| 2017/0366125 A1* | 12/2017 | Joyce | H02P 9/006 |

* cited by examiner

FAULT DETECTION IN A LOW VOLTAGE DIFFERENTIAL SIGNALING (LVDS) SYSTEM

BACKGROUND

Field

This disclosure relates generally to fault detection, and more specifically, to fault detection in a low voltage differential signaling (LVDS) system.

Related Art

LVDS is a technical standard that specifies electrical characteristics of a differential, serial communications protocol. LVDS typically operates at low power and can run at very high speeds, such as 5 Gbps. In an LVDS transmission system, differential signals are provided via a pair of transmission lines to a load in which the pair of lines carry complementary signals. In one example, the pair of transmission lines may be twisted wires or traces on a printed circuit board.

Faults can occur at various nodes of an LVDS system. For example, faults can occur with inputs to the transmitter, within the transmitter, within the transmission lines, or within the load. Any of these faults can lead to system failure or permanent damage to the transmitter. Therefore, a need exists for fault detection, along with protection of the transmitter, within an LVDS transmission system.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In an LVDS system differential outputs of an LVDS transmitter are used to detect various fault conditions. The fault conditions may include a load open fault condition, load short fault condition, bandgap reference short fault condition, or stuck at fault conditions of the transmitter, as will be described in more detail below. These faults are detected at the transmitter side of the LVDS system, and can be performed by circuitry located on chip with the LVDS transmitter. Furthermore, upon the detection of certain fault conditions, the LVDS transmitter is disabled so as to protect the LVDS system before damage occurs.

Figure 1:
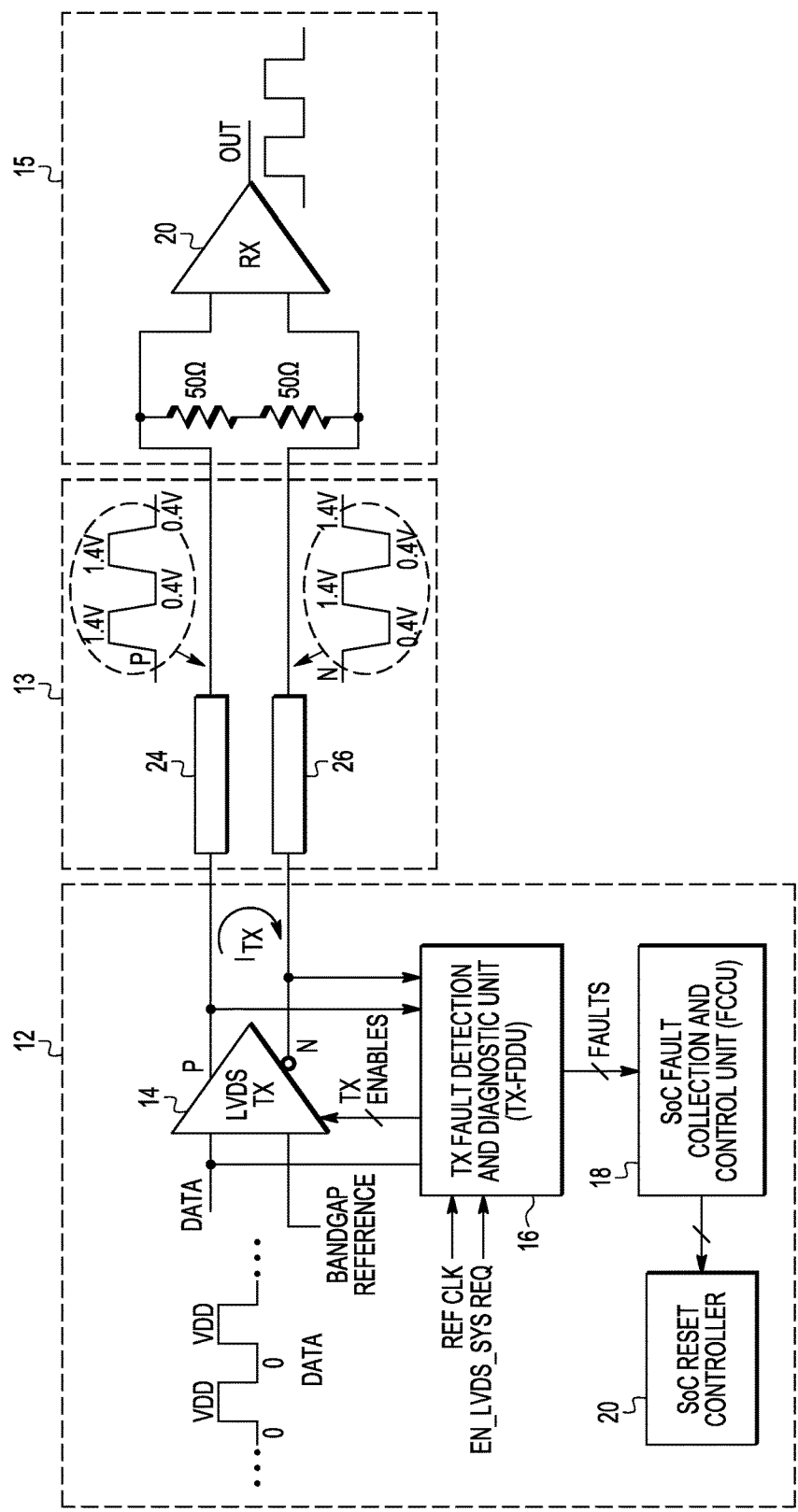
FIG. 1 illustrates, in block diagram form, an LVDS system in accordance with one embodiment of the present invention.

FIG. 1 illustrates, in partial schematic and partial block diagram form, an LVDS system 100 in accordance with one embodiment of the present invention. System 100 includes a first integrated circuit (IC) 12, a second IC 15, and a transmission network 13. Each IC may be a system on a chip (SoC) and therefore may be referred to as SoC 12 and SoC 15, and transmission network 13 may be a printed circuit board (PCB) which routes signals between IC 12 and IC 15 via transmission lines 24 and 26.

IC 12 includes an LVDS transmitter (TX) 14 which receives DATA at a first input and a bandgap reference (BG ref) at a second input, and provides differential output signals P and N, in which P and N are complementary. For example, the input data is a single-ended digital data stream which may include a series of pulses varying between 0 and VDD, as illustrated. Using the BG ref, LVDS TX 14 converts the single-ended data input to a differential output including differential signals P and N, as known in the art. IC 12 includes a TX fault detection and diagnostic unit (TX-FDDU) 16, which receives DATA, P, and N, receives a reference clock (ref clk) and a request for fault diagnostics signal (En_LVDS_sys req), and provides TX enable signals to a control input of LVDS TX 14. TX-FDDU 16 includes circuitry which uses the transmitter differential output signals, P and N, to detect various fault conditions in response to various TX enable signals, as will be described below. TX-FDDU 16 provides an indicator of the faults, FAULTS, to an SoC Fault Collection and Control Unit (FCCU) 18 which can record and keep track of the faults. One or more of these fault indicators may also be a fault interrupt. SoC FCCU 18 is also coupled to an SoC reset controller 20 which is capable of resetting IC 12, if needed, in response to one or more detected faults.

In the illustrated embodiment, the input data, DATA, is converted to a first differential signal P and a second differential signal N, which are complementary to each other. For example, as DATA varies from 0 to VDD, the first differential signal P varies from a first voltage level, e.g. 400 mV, to a second voltage level, e.g. 1400 mV, while the second different signal N varies from the second voltage level to the first voltage level. (Note that examples of waveforms for each of P and N corresponding to the example input DATA are shown FIG. 1 in the dashed circles.) In one embodiment, DATA is a digital data stream provided at a speed of 5 Gigabits-per-second (5 Gbps). The maximum voltage swing between P and N (i.e. P-N), under a normal, no fault, condition is 1V. P and N are provided via transmission lines 24 and 26 which have a standard 100 Ohm termination at SoC 15 represented by two 50 Ohm resistors coupled in series between P and N. Transmission lines 24 and 26 have a characteristic impedance of 100 Ohms in the frequency of transmission. Transmission lines 24 and 26 may be implemented on PCB 13 as a twisted pair of wires or traces. During normal operation, the current through the P/N loop (the path from P, through the termination, and to N) is 10 mA which provides a maximum 1V voltage swing between P and N. The direction of the transitions of the DATA input (from 0 to VDD or VDD to 0) determines the direction of the current in the P/N loop. The circuity of LVDS TX 14 which converts the input DATA to differential signals P and N, using BG ref, is known in the art.

The termination resistors and receiver (RX) 20 are located on SoC 15, in which both SoC 12 and SoC 15 may be attached to PCB 13. In one embodiment, receiver 20 receives the differential pair of signals, P and N, and converts them back to a single-ended signal at its output, OUT. This may then be used by circuitry on SoC 15.

Faults can occur within many places of an LVDS transmission system, which includes the LVDS TX, BG ref, the transmission lines, and the termination. For example, the load may be in an open condition, meaning there is effectively no termination of the P/N loop, causing the loop to be broken. The load may be in a short condition in which the termination (e.g. the termination resistors) is effectively shorted. There may also be a problem with BG ref. For example, in many cases, the circuit which generates the BG reference (which may be, for example, a power module of the SoC) is located far away from the LVDS TX, and there may be a short anywhere along the wire which communicates BG ref to the LVDS TX. There may also be a problem within the LVDS TX itself in which the transmitter or input DATA to the transmitter experiences a stuck at one or a stuck at zero condition, not allowing it to operate properly.

Figures 2, 3:
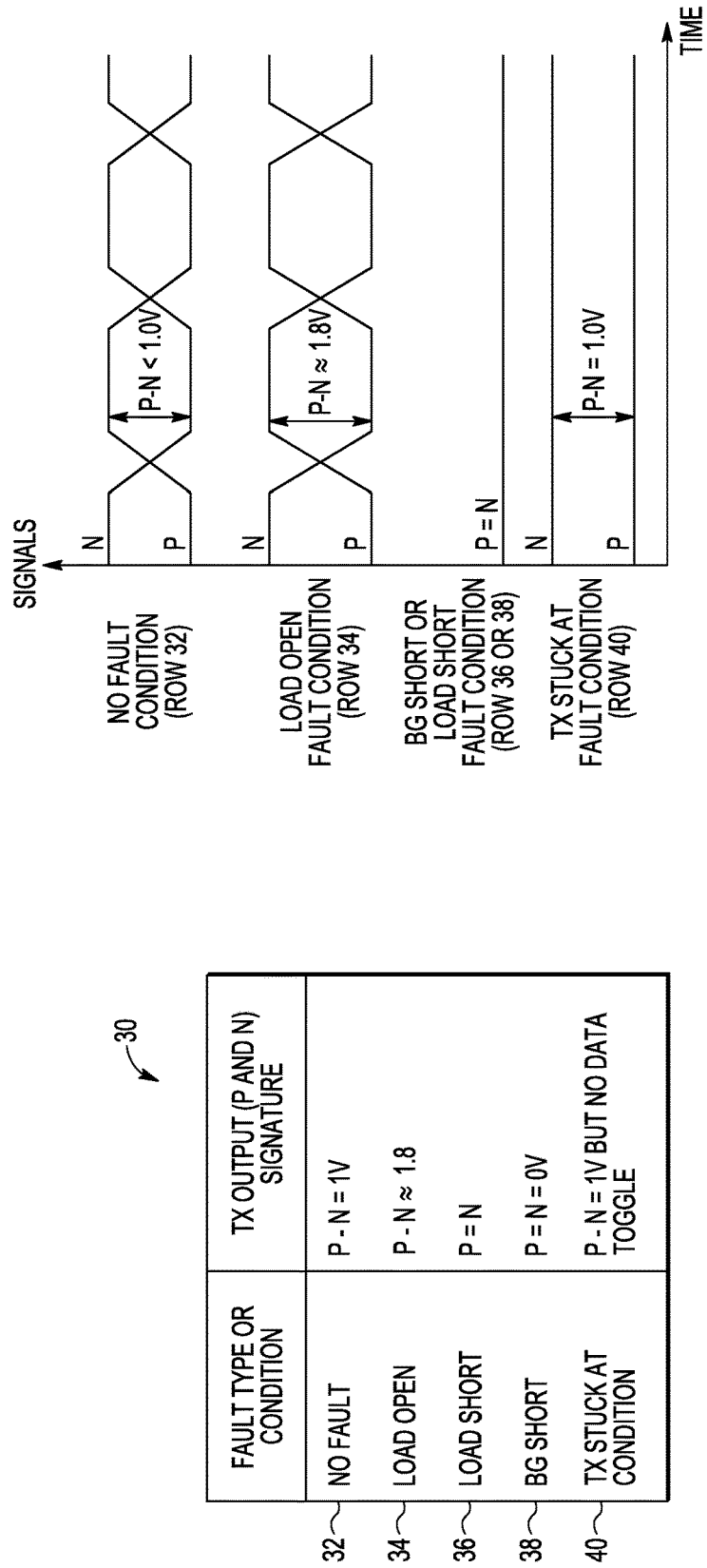
FIG. 2 illustrates, in table form, various fault types or conditions with their corresponding transmitter output signature, in accordance with one embodiment of the present invention.
FIG. 3 illustrates, in diagram form, various fault conditions and the corresponding transmitter output signatures of FIG. 2.

FIG. 2 illustrates, in table form, possible fault conditions, and provides a corresponding transmitter output signature observed with the P and N signals, and FIG. 3 illustrates, in diagrammatic form, examples of P and N for each of these output signatures. Row 32 of table 30 indicates a no fault condition, in which the LVDS transmission operates normally, without a fault. In this case, the maximum swing between P and N is 1V, such that P-N is 1V. This is illustrated in FIG. 3 with both signals toggling in a complementary fashion and maintaining a maximum swing of 1 V. Row 34 indicates a load open fault condition in which the termination is effectively an open circuit, causing a break in the P/N loop. In this situation, due to the configuration of the LVDS transmitter, "P-N" is about 1.8V, which is the supply input voltage to the LVDS TX 14. Regardless of the actual value of P-N, the swing should not be greater than 1V. As illustrated in FIG. 3, although P and N are toggling in opposite directions as expected, the swing reaches about 1.8V, greater than the maximum of 1V.

Row 36 indicates a load short fault condition in which the termination is effectively a short circuit. In this situation, due to the short, P is equal to N. Row 38 indicates a BG short in which P is equal to N and equal to 0V. This is illustrated in FIG. 3 by P being equal to N for both fault conditions. Note that in row 38, P is equal to N, as in row 36, but with a BG short condition, P and N are both 0V while with a load short condition, P is equal to N, but they are not at 0V. Row 40 indicates a transmitter stuck at condition, in which the transmitter or input to the transmitter is stuck at zero or one. In this situation, "P-N" is also at 1V (or less than 1V), but there is no toggling data on P and N in that P remains constantly at a same value and N remains constantly at a same value, as illustrated in FIG. 3. Therefore, although the difference in P and N may indicate a correct swing, the values are not toggling as expected.

Each of the fault conditions discussed in reference to FIGS. 2 and 3 can be detected based on the output signature provided by P and N from LVDS TX 14. In this manner, the receiver inputs and outputs need not be used or analyzed in the fault detections, and the fault detection circuitry can be located on the same chip as LVDS TX 14, implemented, for example, as a Built In Self Test (BIST) circuit in SoC 12. In one embodiment, LVDS TX 14 is enabled, via TX enable signals provided at the control input, to test for these faults. FIGS. 4-7 each illustrate circuitry used in detecting one or more of the fault conditions described above in reference to FIGS. 2 and 3 by analyzing P and N at the output of LVDS TX 14. Each of the circuitry of FIGS. 4-7 is implemented within TX-FDDU 16 of SoC 12.

Figure 4:
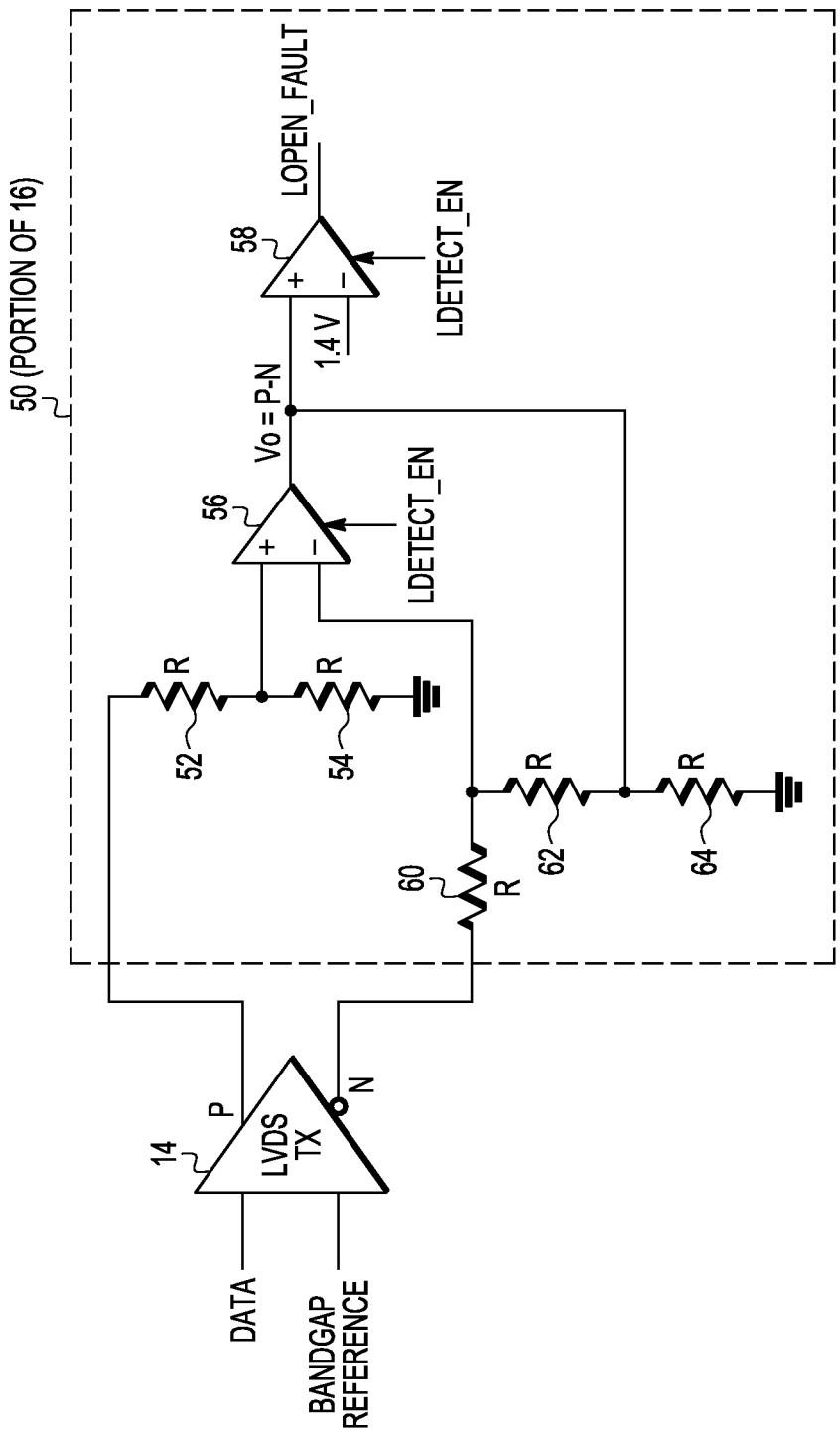
FIGS. 4-7 illustrate, in partial block diagram and partial schematic form, fault detection circuits in accordance with various embodiments of the present invention.

FIG. 4 illustrates, in schematic form, load open fault detection circuitry 50, which is a portion of TX-FDDU 16. Circuitry 50 includes resistors 52, 54, 60, 62, and 64, an operational amplifier (opamp) 56, coupled in an inverting opamp configuration, and a comparator 58. Resistors 52 and 54 coupled in series between P and ground. A non-inverting input of a opamp 56 is coupled to a circuit node between resistors 52 and 54, in which resistors 52 and 54 form a voltage divider on the output voltage at P. Circuitry 50 also includes resistors 60, 62, ad 64. Resistor 60 is coupled in series between N and an inverting input of opamp 56. Resistors 62 and 64 are coupled in series between the inverting input of opamp 56 and ground, and a circuit node between resistors 62 and 64 is coupled to an output of opamp 56. Resistors 52, 54, 60, 62, and 64 each have a resistance value of R. The output of opamp 56 provides Vo, equivalent to "P-N", to a non-inverting input of comparator 58. An inverting input of comparator 58 is coupled to a reference voltage, such as 1.4 V, which provides sufficient margin as to detect when P-N is too far above the maximum swing voltage, or 1V in this embodiment.

In operation, in response to assertion of a TX enable signal, Ldetect_En, which is provided to control inputs of opamp 56 and comparator 58, opamp 56 provides "P-N" to compactor 58 which compares it to 1.4V. If P-N is less than the 1.4V, a fault indicator at the output of comparator 58, Lopen_fault, remains negated. This indicates normal mode in which no fault is detected. However, if "P-N" is greater than 1.4V, Lopen_fault is asserted, indicating a load open fault condition. The use of 1.4V as a reference ensures that P-N is sufficiently greater than 1V to indicate a load open fault detection, since, in one embodiment, for a load open fault, "P-N" is close to 1.8V.

Figure 5:
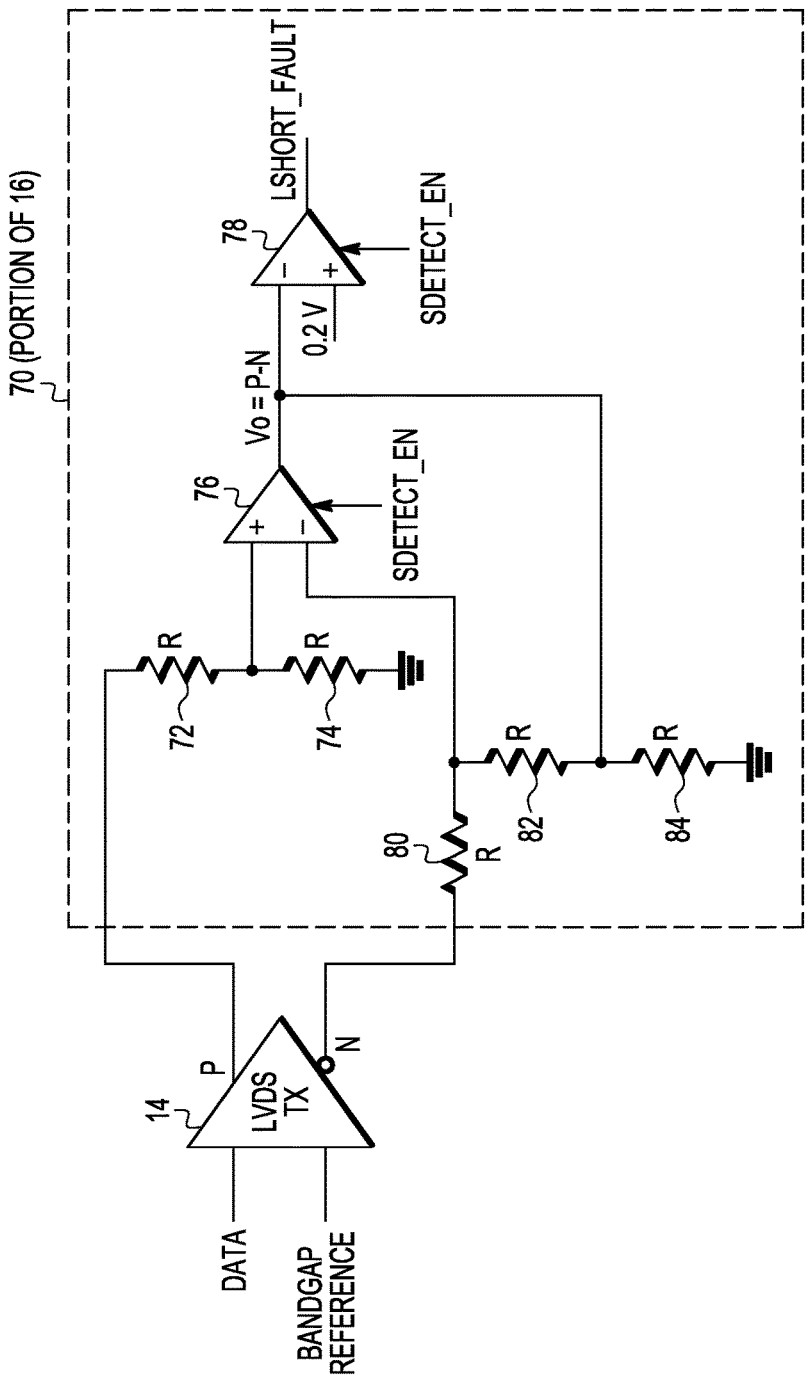

FIG. 5 illustrates, in schematic form, load short fault detection circuitry 70, which is a portion of TX-FDDU 16. Circuitry 70 includes resistors 72, 74, 80, 82, and 84, an operational amplifier (opamp) 76 coupled in an inverting opamp configuration, and a comparator 78. Resistors 72 and 74 are coupled in series between P and ground. A non-inverting input of opamp 76 is coupled to a circuit node between resistors 72 and 74, in which resistors 72 and 74 form a voltage divider on the output voltage at P. Circuitry 70 also includes resistors 80, 82, ad 84. Resistor 80 is coupled in series between N and an inverting input of opamp 76. Resistors 82 and 84 are coupled in series between the inverting input of opamp 76 and ground, and a circuit node between resistors 82 and 84 is coupled to an output of opamp 76. Resistors 72, 74, 80, 82, and 84 each have a resistance value of R. The output of opamp 76 provides Vo, equivalent to "P-N", to an inverting input of comparator 78. A non-inverting input of comparator 78 is coupled to a reference voltage, such as 0.2V, which provides sufficient margin as to detect when "P-N" is close to 0V. Therefore, in one embodiment, this reference voltage that at most 0.2V is used.

In operation, in response to assertion of a TX enable signal, Sdetect_En, which is provided to control inputs of opamp 76 and comparator 78, opamp 76 provides "P-N" to comparator 78 which compares it to 0.2V. If "P-N" is greater than the 0.2V, a fault indicator at the output of comparator 58, Lshort_fault, remains negated. This indicates normal mode in which no fault is detected. However, if "P-N" is less than 0.2V, Lshort_fault is asserted, indicating at least that P is about equal to N. This can indicate either a load open fault condition or a BG short to ground condition.

Figure 6:
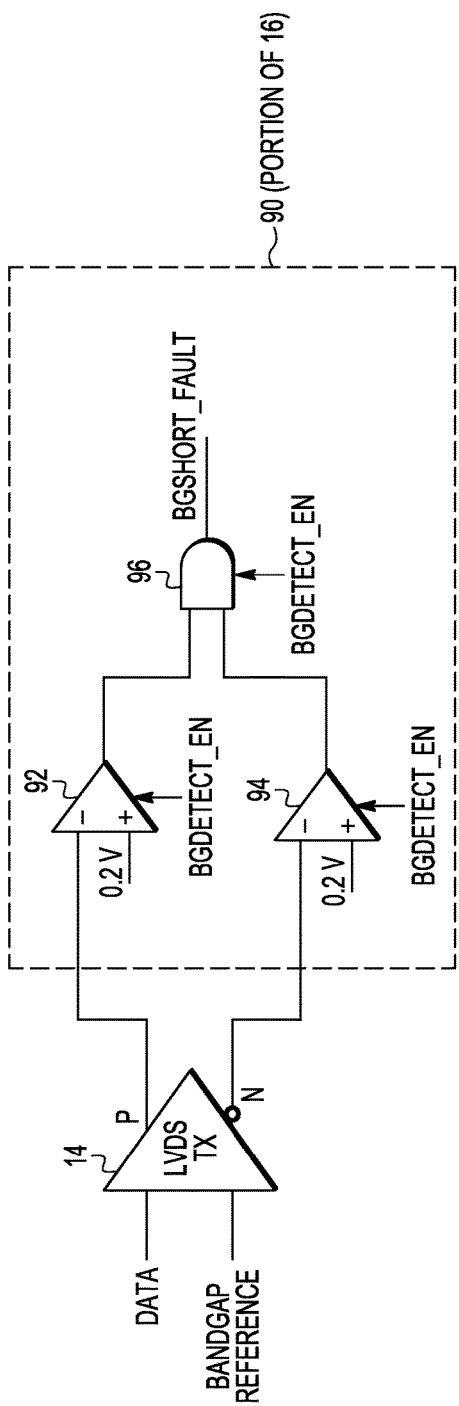

FIG. 6 illustrates, in schematic form, load short fault detection circuitry 90, which is a portion of TX-FDDU 16. Circuitry 90 includes comparators 92 and 94 and gate 96. An inverting input of comparator 92 is coupled to receive P, and a non-inverting input of comparator 92 is coupled to receive a reference, such as 0.2V, to indicate whether P is close to 0V. Similarly, an inverting input of comparator 94 is coupled to receive N, and a non-inverting input of comparator 94 is coupled to receive a reference, such as 0.2V, to indicate whether N is close to 0V. In one embodiment, each reference provided to comparator 92 or 94 is at most 0.2V. An output of comparator 92 is coupled to a first input of AND gate 96, an output of comparator 94 is coupled to a second input of AND gate 96, and an output of AND gate 96 fault indicator, BGshort_fault.

In operation, in response to assertion of a TX enable signal, BGdetect_En, which is provided to control inputs of comparators 92 and 94 and of AND gate 96, when P is less than 0.2V, the output of comparator 92 is asserted to a logic level one and when N is less than 0.2V, the output of comparator 94 is asserted to a logic level one. Therefore, BGshort_fault at the output of AND gate 96 is asserted when each of P and N are close to 0V. That is, BGshort_fault is asserted when P is approximately equal to N and approximately equal to 0V. BGshort_fault remains negated at a logic level zero when no BG short fault detected. As described above in reference to FIGS. 2 and 3, if there is a load short fault condition, P and N would be approximately equal but not also approximately equal to 0V (or less than 0.2V). Therefore if Lshort_fault is negated, then there is no load short fault condition and there is no BG short condition. However, if Lshort_fault is asserted, there may be a load short fault condition or a BG short condition, depending on the value of BGshort_fault. For instance, if BGshort_fault is negated, then a load short fault condition is indicated, and if BGshort_fault is asserted, then a BG short condition is indicated.

Figure 7:
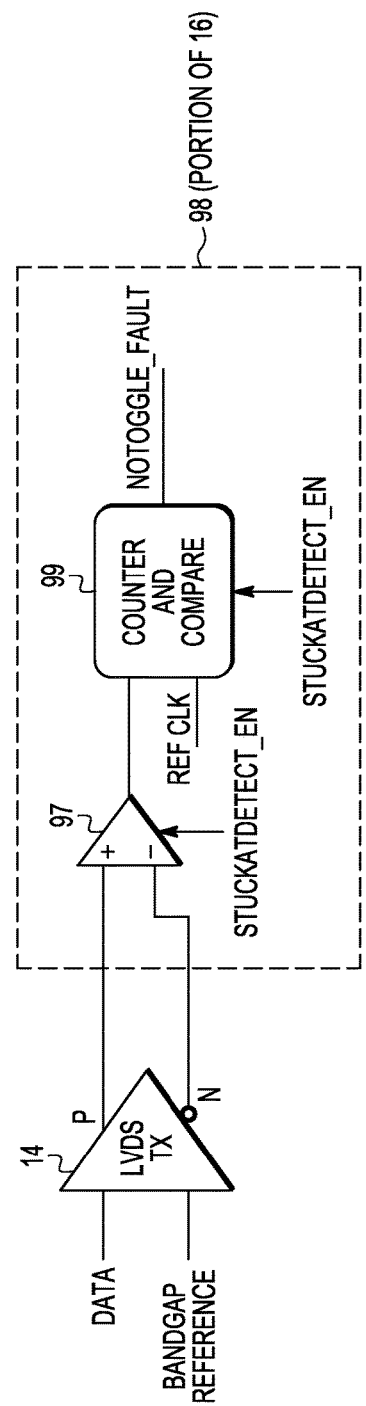

FIG. 7 illustrates, in partial schematic and partial block diagram form, stuck at fault detection circuitry 98, which is a portion of TX-FDDU 16. Circuitry 98 includes a receiver 97 and counter and compare circuit 99. A first input of receiver 97 is coupled to receive P and a second input of receiver 97 is coupled to receive N. An output of receiver 97 is coupled to counter and compare circuit 99, which is also coupled to receive ref clk. An output of counter and compare circuit 99 provides a fault indicator, notoggle_fault.

In operation, a digital test data stream is provided to the DATA input of transmitter 14 and transmitter 14 outputs P and N in response to the test data stream. In response to assertion of a TX enable signal, Stuckatdetect_En, which is provided to control inputs of receiver 97 and counter and compare circuit 99, receiver 97 converts differential outputs P and N to a single-ended test signal which is provided to counter and compare circuit 99. The counter in counter and compare circuit 99 counts edges of the single-ended test signal from receiver 97 over a predetermined period of time, as determined by clock cycles of ref clk. When P and N are not toggling, the single-ended test signal does not toggle either, and a counter value of the counter remains at zero since there are no edges to count. However, if P and N are toggling, the single-ended test signal will also toggle, and the counter will count edges or transitions of the single-ended test signal.

If, after the predetermined period of time, the counter value is greater than a threshold value (min_allowed), notoggle_fault is negated to indicate that P and N are toggling a minimum amount. However, if the counter value is less than that threshold value (or is 0), notoggle_fault is asserted to indicate P and N are not toggling as they should. The comparison of the counter value and the threshold can be performed by a comparator within counter and compare circuit 99. Also, counters and comparators can be used with ref clk to appropriately set the predetermined period or window of time for determining the count value. Note that the threshold value (min_allowed) can be determined by the digital test data stream received by the DATA input and the length of the predetermined period or window of time for determining the count value.

Figure 8:
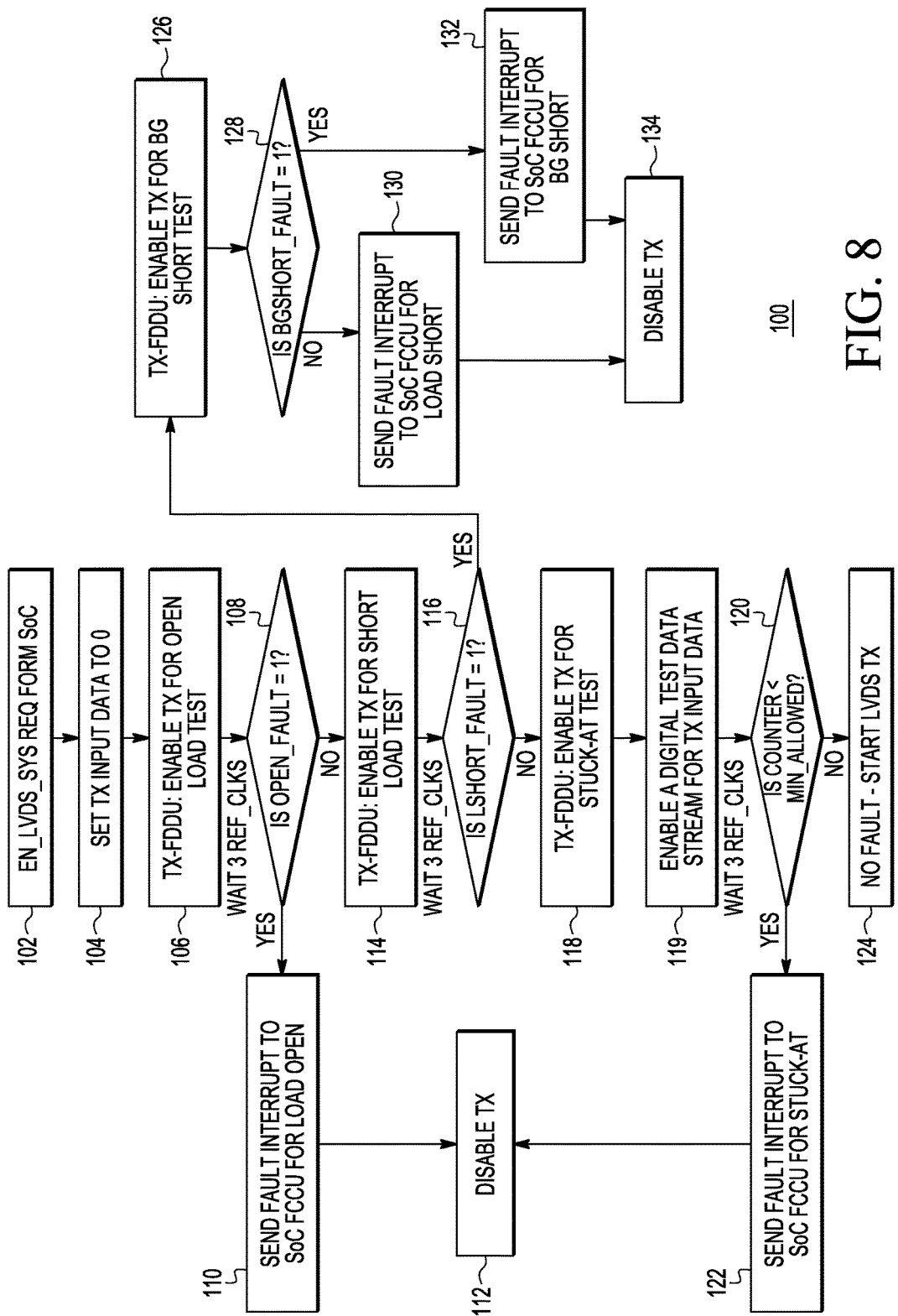
FIG. 8 illustrates, in flow diagram form, a method of detecting faults in the LVDS system of FIG. 1, in accordance with one embodiment of the present invention.

FIG. 8 illustrates, in flow diagram form, a method 100 of performing fault diagnostics on LVDS TX 14 by TX-FDDU 16. Method 100 begins with block 104 by receiving the request for fault diagnostics, En_LVDS_sys req, from SoC 12. This can be received from any control circuit, such as, for example, a central processing unit, of SoC 12. In response to the request, a fault diagnostic mode is entered in which the fault diagnostics are performed. In block 104, TX-FDDU 16 sets or forces the input data to a logic level 0. Then, in block 106, TX-FDDU 16 enables TX 14 for the open load test by asserting Ldetect_En, discussed above in reference to circuity 50 of FIG. 4. After asserting Ldetect_En, TX-FDDU 16 waits for a predetermined number of clock cycles of ref clk. This predetermined number of clock cycles is three, in one embodiment. Afterwards, it is determined if Lopen_fault is asserted at a logic level one (at decision diamond 108). If so, a load open fault condition is indicated (due, for example, to an open in PCB 13) and method 100 proceeds with block 110 in which a fault interrupt or indicator is sent to SoC FCCU 18 indicating the fault. SoC FCCU 18 collects and stores the fault indicators received from TX-FDDU 16. In this manner, they can be reported outside the SoC to a user. After block 110, the TX 14 is disabled in block 112 to protect TX 14 from possible failures or permanent damage, due, for example, to overvoltage. In one embodiment, TX-FDDU 16 disables TX 14. Also, upon disabling TX 14, SoC FCCU 18 can send notification to SoC 20 to reset SoC 12.

Referring back to decision diamond 108, if Lopen_fault is deasserted and thus not a logic level one, method 100 proceeds to block 114 in which TX-FDDU 16 enables TX 14 for the short load test by asserting Sdetect_En, discussed above in reference to circuitry 70 of FIG. 5. Again, after asserting Sdetect_En, TX-FDDU 16 waits for the predetermined number of clock cycles (e.g. three) of ref clk. Afterwards, it is determined if Lshort_fault is asserted at a logic level one (at decision diamond 116). If so, either a load short condition or a BG short condition is indicated, as discussed above in references to FIGS. 5 and 6. Therefore, in block 126 TX-FDDU 16 enables TX 14 for the BG short test by asserting BGdetect_En, as discussed above in reference to circuitry 90 of FIG. 6. At decision diamond 128, it is determined if BGshort_fault is asserted at a logic level one or not. If not, the combination of Lshort_fault being asserted but BGshort_fault being deasserted indicates a load short fault condition. In this case, at block 130, TX-FDDU 16 sends a fault interrupt or indicator indicating the fault is sent to SoC FCCU 18 for collection and storage. TX 14 is then disabled at block 134 to protect TX 14 from possible failures or permanent damage. If, however, at decision diamond 128, BGshort_fault is asserted at a logic level one, then the combination of both Lshort_fault and BGshort_fault being asserted indicates a BG short fault condition. In this case, at block 132, TX-FDDU 16 sends a fault interrupt or indicator indicating the fault is sent to SoC FCCU 18 for collection and storage. Also, TX 14 may then be disabled at block 134.

However, alternately, TX 14 may not be disabled since a BG short is unlikely to cause damage to TX 14.

Referring back to decision diamond 116, if Lshort_fault is not asserted, method 100 proceeds to block 118 in which TX-FDDU 16 enables TX 14 for the stuck-at test by asserting Stuckatdetect_En, as discussed above in reference to circuit 98 of FIG. 7. In block 119, TX-FDDU 16 enables a digital test data stream as the input DATA for TX 14. That is, the TX Input Data is no longer forced to zero. After enabling the digital test data stream, TX-FDDU 16 waits for a predetermined number of clock cycles (e.g. three) of ref clk. This predetermined number of clock cycles determines the predetermined time period or window for determining the counter value. Note that this predetermined number of clock cycles of ref clk can be more or fewer than three. During the predetermined number of clock cycles, the counter is counting edges or transitions of the single-ended test output of receiver 97 resulting from the test data stream at the DATA input of transmitter 14. It is then determined (at decision diamond 120) if the counter value of the counter is less than the predetermined threshold, min_allowed. If so, a stuck at fault condition is indicated and a fault interrupt or indicator is sent to SoC FCCU 18, indicating the fault. TX 14 may then be disabled at block 112. If, however, the counter value is not less than min_allowed, no stuck at fault is indicated and method 100 proceeds at block 124. At block 124, no fault is indicated in TX 14 (since, to get to block 124, all fault tests have to come up negative). At this point, using only the input and outputs of TX 14, and not input and outputs of a receiver coupled to TX 14 and located on a separate IC or SoC, a full set of diagnostics are completed and LVDS TX 14 can be started for normal operation, without faults and without risking failures or permanent damage due to the fault conditions described above.

Therefore, by now it should be appreciated that there has been provided a method and circuitry which is capable of detecting fault conditions in an LVDS TX and also, optionally disabling the TX in response to one or more fault conditions to protect the TX from possible failures and permanent damage due, for example, to overcurrent. The detected fault conditions include an open load fault condition, short load fault condition, BG short fault condition, and stuck at fault condition, and the faults are detected at the LVDS transmitter, by using its DATA input and P and N differential outputs. In this manner, fault detection need not performed on the RX side at the LVDS receiver stage, and can therefore all be done with circuitry located on the same SoC as the LVDS TX.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the order of the test performed with method 100 can be arranged differently, and more or fewer fault tests can be performed with TX-FDDU 16. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a transmitter having a data input coupled to receive a single-ended data signal, a reference input coupled to receive a bandgap reference, a first differential output, and a second differential output, wherein the transmitter is configured to, during normal operation, convert the single-ended data signal at the data input into a first differential signal at the first differential output and a second differential signal at the second differential output in which the first differential signal and the second differential signal are complementary to each other; a fault detection circuit coupled to the first and second differential outputs and configured to detect a load short fault condition and a bandgap short condition based on the first and second differential signals at the first and second differential outputs while forcing the data input to zero. In one aspect of this embodiment, the fault detection circuit is configured to detect the load short fault condition in response to determining that the first differential signal is equal to the second differential signal within a first predetermined margin but that the first differential signal or the second differential signal is not equal to zero within a second predetermined margin. In another aspect, the fault detection circuit is configured to disable the transmitter in response to assertion of the load short fault indicator. In another aspect, the fault detection circuit is configured to detect the bandgap short condition in response to determining both that first differential signal is equal to the second differential signal within the first predetermined margin and that each of the first differential signal and the second differential signal are equal to zero within the second predetermined margin. In a further aspect, the fault detection circuit includes an operational amplifier (opamp) having a non-inverting input coupled via a first resistor to the first differential output, an inverting input coupled via a second resistor to the second differential output, and an output configured to provide a voltage representing a difference between the first and second differential signals; and a first comparator having a first input coupled to receive the output of the operational amplifier and a second input coupled to receive a first reference. In yet a further aspect, the fault detection circuit includes a second comparator having a first input coupled to the first differential output and a second input coupled to a second reference; a third comparator having a first input coupled to the second differential output and a second input coupled to the second reference; and an AND gate coupled to the outputs of each of the second and third comparators. In a yet further aspect, the first reference provides the first predetermined margin and the second reference provides the second predetermined margin. In yet another aspect, a communication system includes the integrated circuit of this embodiment, and further includes a second integrated circuit, separate from the integrated circuit, and having a receiver, wherein the receiver is coupled to the transmitter via transmission lines between the integrated circuit and the second integrated circuit, wherein the fault detection unit detects the load short condition and the bandgap short condition using only outputs and inputs within the integrated circuit and not any outputs or inputs of the second integrated circuit. In yet another aspect, the fault detection circuit is configured to detect an load open fault condition based on the first and second differential signals at the first and second differential outputs while forcing the data input to zero by determining that a voltage difference between the first differential signal and the second differential signal is greater than a maximum allowable voltage swing between the first and second differential signals. In yet another aspect, the fault detection circuit is configured to detect a stuck at fault condition when providing a digital test data stream at the data input of the transmitter by determining that a single-ended test signal formed from the first and second differential signals in response to the digital test data stream does not toggle within a predetermined window of time.

In another embodiment, a method within an integrated circuit having a transmitter, wherein the transmitter has a data input coupled to receive a single-ended data signal, a reference input coupled to receive a bandgap reference, a first differential output, and a second differential output, includes during normal operation, the transmitter providing a first differential signal at the first differential output and a second differential signal at the second differential output in which the first differential signal and the second differential signal are complementary to each other; entering a fault diagnostic mode; while in the fault diagnostic mode and forcing the data input to zero: detecting a load short fault condition resulting in a short of a load of the transmitter when the first differential signal is equal to the second differential signal within a first predetermined margin but the first differential signal or the second differential signal is not equal to zero within a second predetermined margin; and detecting a bandgap short condition of the bandgap reference when both that first differential signal is equal to the second differential signal within the first predetermined margin and each of the first differential signal and the second differential signal are equal to zero within the second predetermined margin. In one aspect of this another embodiment, the method further includes, while in the fault diagnostic mode and forcing the data input to zero, detecting an load open fault condition when a voltage difference between the first differential signal and the second differential signal is greater than a maximum allowable voltage swing between the first and second differential signals. In a further aspect, the method further includes, while in the fault diagnostic mode and providing a digital test data stream to the data input, detecting a stuck at fault condition by determining that a single-ended test signal formed from the first and second differential signals in response to the digital test data stream does not toggle within a predetermined window of time. In a further aspect, the method further includes disabling the transmitter in response to detecting a load short fault condition, an open load fault condition, or a stuck at fault condition. In yet a further aspect, the method further includes disabling the transmitter in response to detecting the bandgap short fault condition. In another yet further aspect, the method further includes when, during the fault diagnostic mode, no load short fault condition, no bandgap fault condition, no open load fault condition, and no stuck at fault condition are detected, enabling the transmitter for normal operation. In another aspect, the method further includes upon detecting the load short fault condition, storing a load short fault indicator in fault storage circuitry; upon detecting the bandgap fault condition, storing a bandgap fault indicator in the fault storage circuitry; upon detecting the open short fault condition, storing an open short fault indicator in the fault storage circuitry; and upon detecting a stuck at fault condition, storing a stuck at fault indicator in the fault storage circuitry. In another aspect, during the fault diagnostic mode, only inputs and outputs within the integrated circuit having the transmitter is used to detect any of the load short fault condition, the bandgap fault condition, the open load fault condition, and the stuck at fault condition are detected.

In yet another embodiment, an integrated circuit includes a transmitter having a data input coupled to receive a single-ended data signal, a reference input coupled to receive a bandgap reference, a first differential output, and a second differential output, wherein the transmitter is configured to, during normal operation, convert the single-ended data signal at the data input into a first differential signal at the first differential output and a second differential signal at the second differential output in which the first differential signal and the second differential signal are complementary to each other; a fault detection circuit coupled to the first and second differential outputs and configured to, while providing a digital test data stream to the data input of the transmitter, detect a stuck at fault condition by determining that a single-ended test signal formed by combining the first and second differential signals which are generated by the transmitter using the digital test data stream does not sufficiently toggle within a predetermined window of time. In one aspect of the yet another embodiment, the fault detection circuit includes a receiver and a counter, wherein inputs of the receiver are coupled to the first and second differential outputs and the receiver is configured to combine the first and second differential signals into the single-ended test signal and provide the single-ended test signal to an input of the counter, and a stuck at fault condition is detected when a counter value of the counter, after the predetermined window of time, is less than an allowed minimum of transitions of the single-ended test signal.

What is claimed is:

1. An integrated circuit comprising:
    a transmitter having a data input coupled to receive a single-ended data signal, a reference input coupled to receive a bandgap reference, a first differential output, and a second differential output, wherein the transmitter is configured to, during normal operation, convert the single-ended data signal at the data input into a first differential signal at the first differential output and a second differential signal at the second differential output in which the first differential signal and the second differential signal are complementary to each other;
    a fault detection circuit coupled to the first and second differential outputs and configured to:
        detect a load short fault condition and a bandgap short condition based on the first and second differential signals at the first and second differential outputs while forcing the data input to zero.

2. The integrated circuit of claim 1, wherein the fault detection circuit is configured to detect the load short fault condition in response to determining that the first differential signal is equal to the second differential signal within a first predetermined margin but that the first differential signal or the second differential signal is not equal to zero within a second predetermined margin.

3. The integrated circuit of claim 2, wherein the fault detection circuit is configured to disable the transmitter in response to assertion of the load short fault indicator.

4. The integrated circuit of claim 2, wherein the fault detection circuit is configured to detect the bandgap short condition in response to determining both that first differential signal is equal to the second differential signal within the first predetermined margin and that each of the first differential signal and the second differential signal are equal to zero within the second predetermined margin.

5. The integrated circuit of claim 4, wherein the fault detection circuit comprises:
    an operational amplifier (opamp) having a non-inverting input coupled via a first resistor to the first differential output, an inverting input coupled via a second resistor to the second differential output, and an output configured to provide a voltage representing a difference between the first and second differential signals; and
    a first comparator having a first input coupled to receive the output of the operational amplifier and a second input coupled to receive a first reference.

6. The integrated circuit of claim 5, wherein the fault detection circuit comprises:
    a second comparator having a first input coupled to the first differential output and a second input coupled to a second reference;
    a third comparator having a first input coupled to the second differential output and a second input coupled to the second reference; and
    an AND gate coupled to the outputs of each of the second and third comparators.

7. The integrated circuit of claim 6, wherein the first reference provides the first predetermined margin and the second reference provides the second predetermined margin.

8. A communication system comprising the integrated circuit of claim 1 and further comprising:
    a second integrated circuit, separate from the integrated circuit, and having a receiver, wherein the receiver is coupled to the transmitter via transmission lines between the integrated circuit and the second integrated circuit, wherein the fault detection unit detects the load short condition and the bandgap short condition using only outputs and inputs within the integrated circuit and not any outputs or inputs of the second integrated circuit.

9. The integrated circuit of claim 1, wherein the fault detection circuit is configured to:
    detect an load open fault condition based on the first and second differential signals at the first and second differential outputs while forcing the data input to zero by determining that a voltage difference between the first differential signal and the second differential signal is greater than a maximum allowable voltage swing between the first and second differential signals.

10. The integrated circuit of claim 1, wherein the fault detection circuit is configured to:
    detect a stuck at fault condition when providing a digital test data stream at the data input of the transmitter by determining that a single-ended test signal formed from the first and second differential signals in response to the digital test data stream does not toggle within a predetermined window of time.

11. A method within an integrated circuit having a transmitter, wherein the transmitter has a data input coupled to receive a single-ended data signal, a reference input coupled to receive a bandgap reference, a first differential output, and a second differential output, comprising:
    during normal operation, the transmitter providing a first differential signal at the first differential output and a second differential signal at the second differential output in which the first differential signal and the second differential signal are complementary to each other;

entering a fault diagnostic mode;

while in the fault diagnostic mode and forcing the data input to zero:
  detecting a load short fault condition resulting in a short of a load of the transmitter when the first differential signal is equal to the second differential signal within a first predetermined margin but the first differential signal or the second differential signal is not equal to zero within a second predetermined margin; and
  detecting a bandgap short condition of the bandgap reference when both that first differential signal is equal to the second differential signal within the first predetermined margin and each of the first differential signal and the second differential signal are equal to zero within the second predetermined margin.

12. The method of claim 11, further comprising:
while in the fault diagnostic mode and forcing the data input to zero:
  detecting an load open fault condition when a voltage difference between the first differential signal and the second differential signal is greater than a maximum allowable voltage swing between the first and second differential signals.

13. The method of claim 12, further comprising:
while in the fault diagnostic mode and providing a digital test data stream to the data input:
  detecting a stuck at fault condition by determining that a single-ended test signal formed from the first and second differential signals in response to the digital test data stream does not toggle within a predetermined window of time.

14. The method of claim 13, further comprising:
disabling the transmitter in response to detecting a load short fault condition, an open load fault condition, or a stuck at fault condition.

15. The method of claim 14, further comprising:
disabling the transmitter in response to detecting the bandgap short fault condition.

16. The method of claim 14, further comprising:
when, during the fault diagnostic mode, no load short fault condition, no bandgap fault condition, no open load fault condition, and no stuck at fault condition are detected, enabling the transmitter for normal operation.

17. The method of claim 13, further comprising:
upon detecting the load short fault condition, storing a load short fault indicator in fault storage circuitry;
upon detecting the bandgap fault condition, storing a bandgap fault indicator in the fault storage circuitry;
upon detecting the open short fault condition, storing an open short fault indicator in the fault storage circuitry; and
upon detecting a stuck at fault condition, storing a stuck at fault indicator in the fault storage circuitry.

18. The method of claim 13, wherein, during the fault diagnostic mode, only inputs and outputs within the integrated circuit having the transmitter is used to detect any of the load short fault condition, the bandgap fault condition, the open load fault condition, and the stuck at fault condition are detected.

19. An integrated circuit comprising:
a transmitter having a data input coupled to receive a single-ended data signal, a reference input coupled to receive a bandgap reference, a first differential output, and a second differential output, wherein the transmitter is configured to, during normal operation, convert the single-ended data signal at the data input into a first differential signal at the first differential output and a second differential signal at the second differential output in which the first differential signal and the second differential signal are complementary to each other;
a fault detection circuit coupled to the first and second differential outputs and configured to:
  while providing a digital test data stream to the data input of the transmitter, detect a stuck at fault condition by determining that a single-ended test signal formed by combining the first and second differential signals which are generated by the transmitter using the digital test data stream does not sufficiently toggle within a predetermined window of time.

20. The integrated circuit of claim 19, wherein the fault detection circuit comprises a receiver and a counter, wherein:
inputs of the receiver are coupled to the first and second differential outputs and the receiver is configured to combine the first and second differential signals into the single-ended test signal and provide the single-ended test signal to an input of the counter, and
a stuck at fault condition is detected when a counter value of the counter, after the predetermined window of time, is less than an allowed minimum of transitions of the single-ended test signal.

* * * * *